US008933385B2

(12) United States Patent
Wang et al.

(10) Patent No.: US 8,933,385 B2
(45) Date of Patent: Jan. 13, 2015

(54) HYBRID ANALOG-TO-DIGITAL CONVERTER HAVING MULTIPLE ADC MODES

(75) Inventors: Rui Wang, San Jose, CA (US); Liping Deng, Cupertino, CA (US); Tiejun Dai, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 302 days.

(21) Appl. No.: 13/543,470

(22) Filed: Jul. 6, 2012

(65) Prior Publication Data

US 2014/0008515 A1    Jan. 9, 2014

(51) Int. Cl.
*G01J 1/44*   (2006.01)
*H03M 1/12*   (2006.01)
*H03M 1/38*   (2006.01)

(52) U.S. Cl.
USPC ........................ 250/214 R; 341/156; 341/161

(58) Field of Classification Search
USPC ................... 250/208.1, 214 R; 348/298–311; 257/290–292, 440; 341/156, 161–163, 341/169, 172
See application file for complete search history.

(56) References Cited

U.S. PATENT DOCUMENTS

| 7,205,921 | B1 | 4/2007 | Savla |
| 7,812,757 | B1 | 10/2010 | Wong et al. |
| 8,040,269 | B2 | 10/2011 | Bogaerts |
| 2012/0025062 | A1* | 2/2012 | Neubauer et al. .......... 250/208.1 |
| 2012/0287316 | A1* | 11/2012 | Kim et al. ..................... 348/294 |

OTHER PUBLICATIONS

Xingyuan, T. et al., "A high performance 90 nm CMOS SAR ADC with hybrid architecture," Journal of Semiconductors, vol. 31, No. 1, Jan. 2010 (7 pages).

* cited by examiner

*Primary Examiner* — Georgia Y Epps
*Assistant Examiner* — Carolynn A Moore
(74) *Attorney, Agent, or Firm* — Blakely Sokoloff Taylor & Zafman LLP

(57) ABSTRACT

A hybrid ADC having a successive approximation register (SAR) ADC mode for generating a bit of a digital signal and a ramp ADC mode for generating an additional bit of the digital signal is disclosed. When in the SAR ADC mode, a control circuit is configured to disable a ramp signal generator; disable a counter; and enable a register to control an offset stage to set the magnitude of an offset voltage that is provided to an input of a comparator of the ADC. When in the ramp ADC mode, the control circuit is configured to enable the ramp signal generator to provide a ramp signal to the input of the comparator; enable the counter to begin providing the digital count in response to the output of the comparator; and disable the register so that the offset stage is not providing the offset voltage.

24 Claims, 6 Drawing Sheets

US 8,933,385 B2

HYBRID ANALOG-TO-DIGITAL CONVERTER HAVING MULTIPLE ADC MODES

BACKGROUND

1. Field of the Invention

This disclosure relates generally to hybrid analog-to-digital converters, and in particular, but not exclusively, those used in the readout circuitry of a complementary metal-oxide-semiconductor (CMOS) image sensor.

2. Background Information

Image sensors are ubiquitous. They are widely used in digital still cameras, digital video cameras, cellular phones, security cameras, medical devices, automobiles, and other applications.

Many image sensor applications benefit from an increased high dynamic range (HDR). One way to increase the resolution of ramp analog-to-digital converter (ADC) circuit is by increasing the counter resolution. This will increase the counter time, or the time required to convert analog output voltage from the pixel array into digital values used to construct a digital image which in turn will decrease the frame rate. For example, to increase a ramp ADC resolution from 10 bits to 13 bits will increase the counter time by eight times and may reduce the frame rate by almost one-eighth.

Another way to achieve an increased high dynamic range in a ramp ADC is by reducing the noise on the ramp generator. However, this will increase the power consumption and silicon area is required to increase the high dynamic range of an image sensor.

BRIEF DESCRIPTION OF THE DRAWINGS

The invention may be understood by referring to the following description and accompanying drawings that are used to illustrate embodiments. In the drawings.

DETAILED DESCRIPTION

In the following description, numerous specific details are set forth, such as, for example, specific readout circuits, voltage ramp signals, calibration circuits orders of operations, etc. However, it is understood that embodiments may be practiced without these specific details. In other instances, well-known circuits, structures and techniques have not been shown in detail in order not to obscure the understanding of this description.

Figure 1:
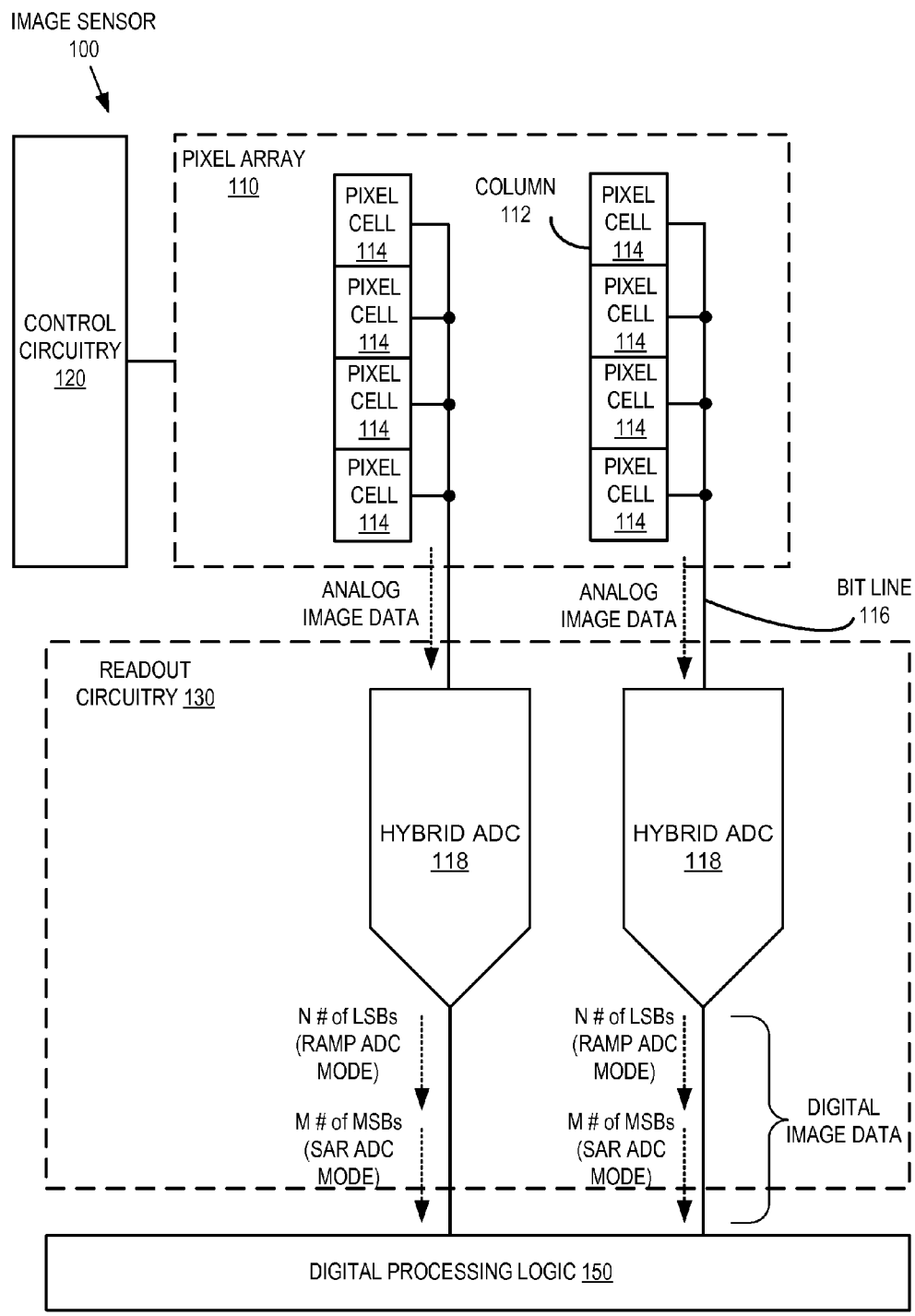
FIG. 1 is a block diagram illustrating an image sensor having multiple hybrid ADCs, in accordance with an embodiment of the present disclosure.

FIG. 1 is a block diagram illustrating image sensor 100 having multiple hybrid ADCs 118, in accordance with an embodiment of the present disclosure. Image sensor 100 includes pixel array 110, control circuitry 120, readout circuitry 130, and optional digital processing logic 150. For simplicity of illustration, the illustrated embodiment of pixel array 110 only shows two columns 112, each having four pixel cells 114. However, it is to be appreciated that actual image sensors commonly include from hundreds to thousands of columns, and each column commonly includes from hundreds to thousands of pixels. Also, the illustrated pixel array 110 is regularly shaped (e.g., each column 112 has the same number of pixels), but in other embodiments the array may have a regular or irregular arrangement different than shown and can include more or less pixels, rows, and columns than shown. Moreover, in different embodiments pixel array 110 may be a color image sensor including red, green, and blue pixels designed to capture images in the visible portion of the spectrum, or may be a black-and-white image sensor and/or an image sensor designed to capture images in the invisible portion of the spectrum, such as infra-red or ultra-violet. In one embodiment, image sensor 100 is a complementary metal oxide semiconductor (CMOS) image sensor.

During use, after pixel cell 114 has acquired its image data or charge, the analog image data (e.g., analog signal) or charge may be read out of the pixel cell to readout circuitry 130 via column readout lines or bit lines 116. The analog image data from pixel cells 114 of each column 112 is read out via bit line 116 one pixel at a time to readout circuitry 130 and then transferred to hybrid ADCs 118.

Hybrid ADCs 118 are multiple mode ADCs. Specifically, the illustrated embodiment of hybrid ADCs 118 are dual mode ADCs having (1) successive approximation register (SAR) ADC mode; and (2) ramp ADC mode. Thus, each ADC 118 may convert a portion of the analog image data using SAR analog-to-digital conversion, while the same ADC 118 converts another portion of the analog image data using ramp analog-to-digital conversion. In one embodiment, an M number of most significant bits (MSBs) of the digital signal is provided by hybrid ADC 118 while in a SAR ADC mode, while the remaining N number of least significant bits (LSB) of the digital signal is provided by the hybrid ADC 118 while in the ramp ADC mode. The resultant digital signal output from readout circuitry 130 may be an (M+N)-bit digital output. In the illustrated embodiment, hybrid column ADC 118 is used in an image sensor 100. However, in other embodiments, hybrid column ADC 118 may be used in other semiconductor circuits.

Figure 2:
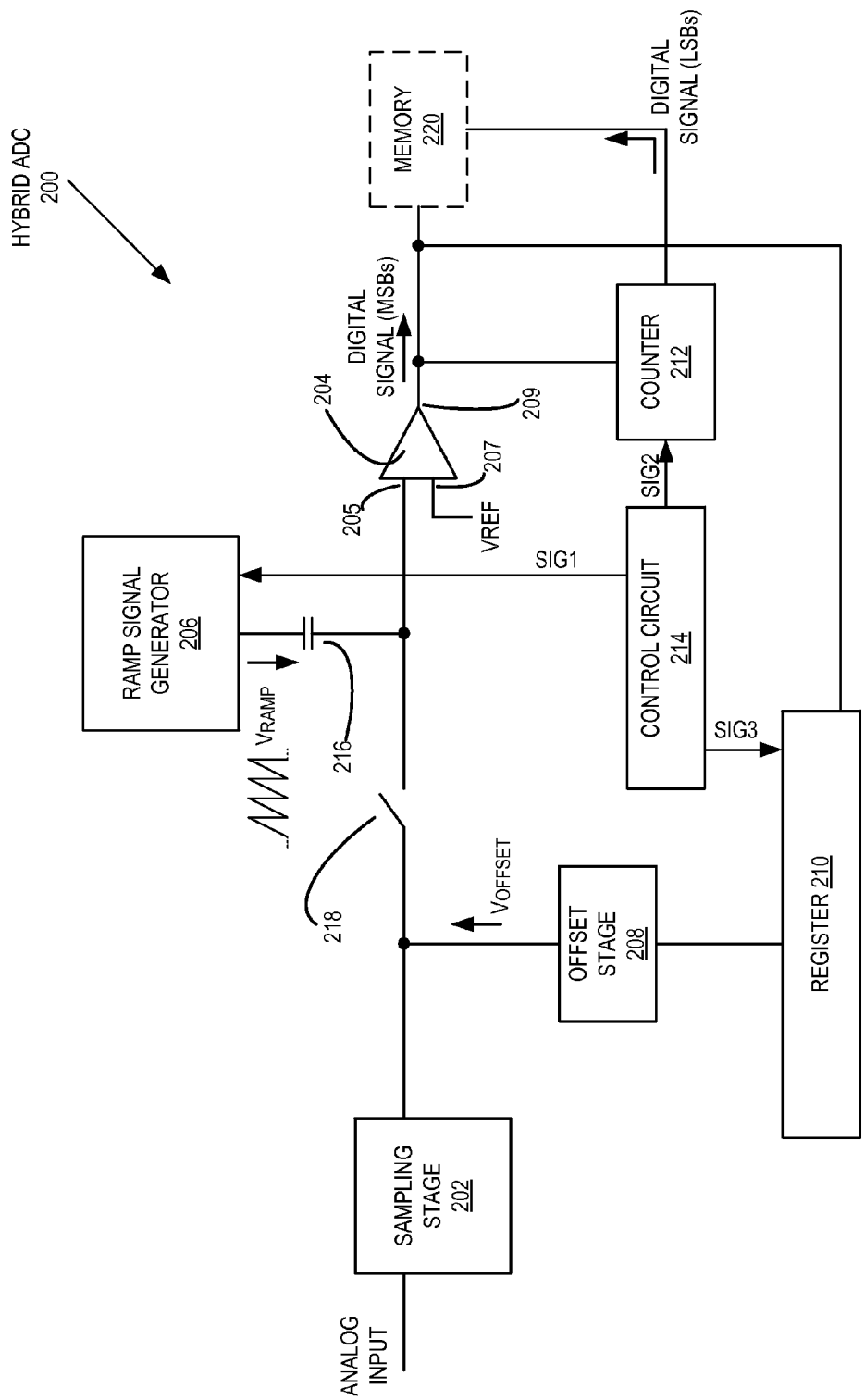
FIG. 2 is a block diagram illustrating an example hybrid ADC, in accordance with an embodiment of the present disclosure.

FIG. 2 is a block diagram illustrating an example of hybrid ADC 200, in accordance with an embodiment of the present disclosure. The illustrated example of hybrid ADC 200 includes sampling stage 202, comparator 204, ramp signal generator 206, offset stage 208, register 210, counter 212, control circuit 214, and optional memory 220. Hybrid ADC 200 is one possible implementation of hybrid ADC 118 of FIG. 1.

As shown in FIG. 2, sampling stage 202 is coupled to receive an analog input, which in one example may be analog image data from a column bit line of a CMOS image sensor. Once sampled, switch 218 may be closed so that sampling stage 202 may provide a sampled analog signal to input 205 of comparator 204. Thus, comparator 204 has one input 205 coupled to receive the sampled analog signal and another input 207 coupled to receive a reference voltage VREF. In one example, the reference voltage VREF is the black level voltage for the current pixel being sampled. As will become clearer from the further description below, hybrid ADC 200 includes some components that are used exclusively when in SAR ADC mode, and others that are used exclusively when in the ramp ADC mode. However, comparator 204 is used in both modes for comparing the sampled analog signal with the reference voltage VREF. Having comparator 204 that is shared between modes of analog-to-digital conversion may reduce the overall component count of the integrated circuit and thus reduce manufacturing costs and/or power consumption of the device.

Also shown in FIG. 2 is offset stage 208 and register 210. Offset stage 208 is coupled to selectively provide a variable offset voltage $V_{OFFSET}$ to input 205 of comparator 204, while register 210 is coupled to control offset stage 208 to set a magnitude of the offset voltage $V_{OFFSET}$ in response to output 209 of comparator 204. Thus, comparator 204, register 210, and offset stage 208 works together to provide at least one bit of the digital signal, when hybrid ADC 200 is in the SAR ADC mode. When in SAR ADC mode, hybrid ADC 200 successively approximates the digital output value one bit at a time, starting from the most significant bit. As each digital output value is obtained, it is written into memory 220. A hybrid ADC that generates M number of bits of the digital signal when in SAR ADC mode may take approximately M clock cycles to complete its conversion of the M number of bits. In one embodiment, the M number of bits are the most significant bits of the digital signal.

FIG. 2 further illustrates ramp signal generator 206 that is coupled (by way of capacitor 216) to provide a ramp signal $V_{RAMP}$ to input of comparator 204. Ramp signal generator 206 works in conjunction with counter 212 and comparator 204 to provide at least one bit of the digital signal when hybrid ADC 200 is in the ramp ADC mode. For example, in one embodiment, counter 212 is triggered to begin counting at the beginning of a cycle of the ramp signal $V_{RAMP}$. The ramp signal varies the voltage at input 205 of comparator 204. Once, the voltage at input 205 reaches the reference voltage VREF on input 207, output 209 of comparator 205 triggers counter 212 to stop its count. The resultant count on counter 212 may then be read out to memory 220 or otherwise, as representative of one or more bits of the digital signal. In one embodiment, hybrid ADC 200 enters SAR ADC mode to generate M number of MSBs of the digital signal, and then enters into ramp ADC mode to generate N number of LSBs of the digital signal.

In one embodiment, $V_{RAMP}$ may ramp down, for example in a saw tooth voltage ramp that has an initial full scale voltage ($V_{FS}$) that falls a final voltage (e.g., 0V) each cycle. As shown, the output of counter 212 is coupled to memory 220. Counter 212 may increment while $V_{RAMP}$ ramps down. By way of example, counter 212 may be an N-bit counter, where N represents the resolution in bits of the hybrid ADC when in the ramp ADC mode. During each analog-to-digital conversion, the N-bit counter may increment from 0 to $2^N-1$. By way of example, in the particular case of an 8-bit ADC circuit, the counter may increment from 0 to 255, where each different count may represent a different digital level to which voltages from analog input (e.g., analog image data from the pixel cells) are mapped during analog-to-digital conversion. Counter 212 may increment during clock cycles such that an N-bit analog-to-digital conversion may take approximately $2^N$ clock cycles to complete.

When the voltages at inputs 205 and 207 of comparator 204 match, the corresponding memory 220 may latch the output of counter 212. The latched output of counter 212 may represent the digital level to which the amplified analog input voltage from the pixel cell has been mapped during the analog-to-digital conversion. The latched output of counter 212 may then be read out from memory 220 to digital processing logic 150.

Accordingly, embodiments of the example hybrid ADC 200 shown in FIG. 2 include control circuit 214 configured to control various aspects of hybrid ADC 200 when transitioning between modes of analog-to-digital conversion. For example, when in the SAR ADC mode, control circuit 214 may be configured to disable ramp signal generator 206 such that the ramp signal $V_{RAMP}$ is not provided to input 205 of comparator 204. Control circuit 214 may further disable counter 212 to stop counting, and may enable register 210 to begin controlling offset stage to set a magnitude of the offset voltage $V_{OFFSET}$ in response to output 209 of comparator 204, all while in the SAR ADC mode. In one embodiment, ramp signal generator 206 is configured to provide a constant non-zero voltage to input 205 of comparator 204 when ramp signal generator 206 is disabled.

When in the ramp ADC mode, control circuit 214 may be configured to enable ramp signal generator 206 to begin providing the ramp signal $V_{RAMP}$ to input 205 of comparator 204 and also enable counter 212 to begin counting synchronized with beginning of a cycle of the ramp signal $V_{RAMP}$. Control circuit 214 may also disable register 210 such that offset stage 208 is not providing the offset voltage $V_{OFFSET}$ responsive to the output 209 of comparator 204.

In one embodiment, control circuit 214 includes one or more logic circuits, processors and/or discrete circuit components, as will be apparent to one having ordinary skill given the benefit of the present disclosure. In another embodiment, control circuit 214 may be included in the control circuitry 120 of FIG. 1.

Figure 3A:
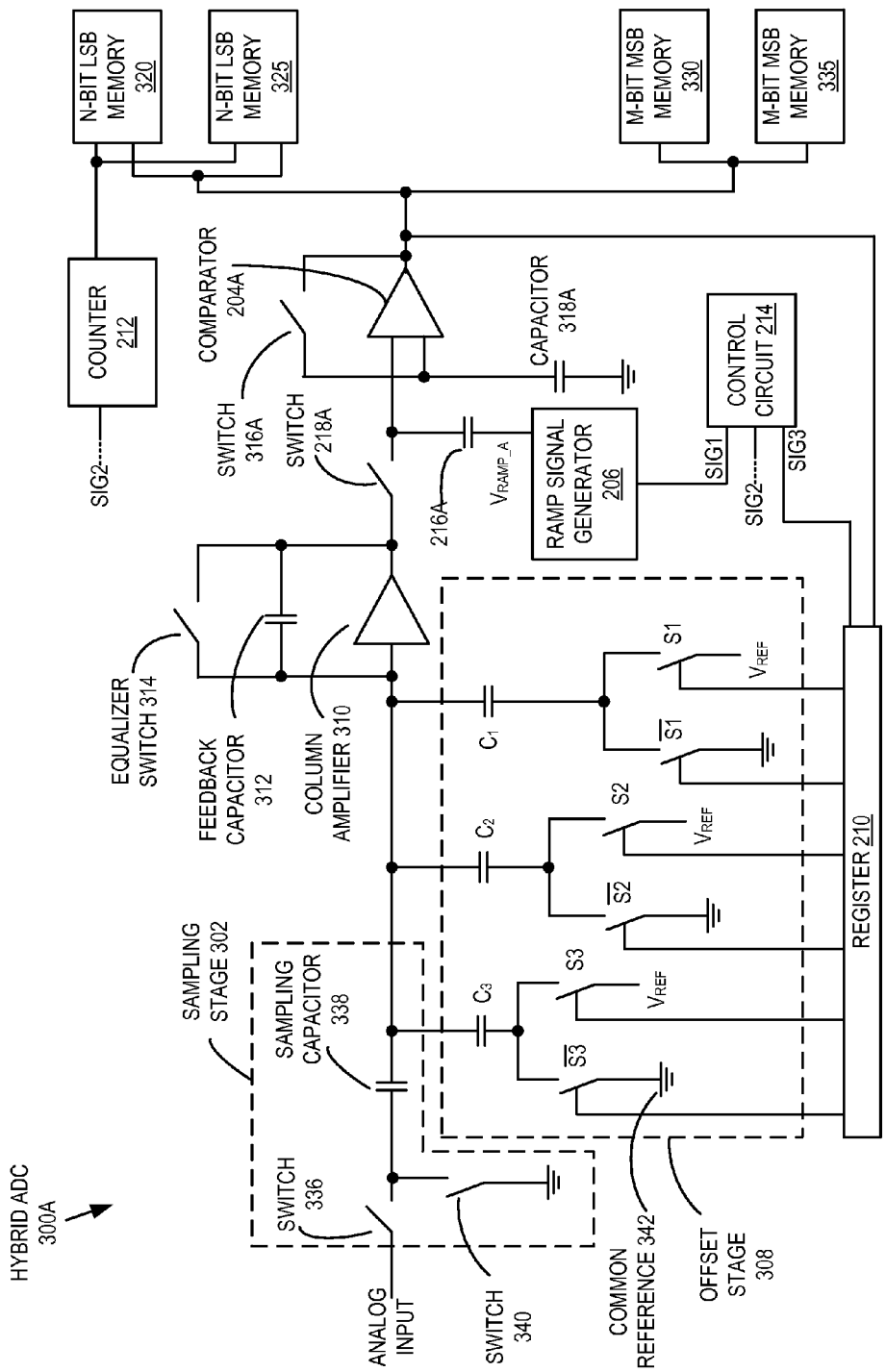
FIG. 3A is a block diagram illustrating a more detailed example of a hybrid ADC, in accordance with an embodiment of the present disclosure.

FIG. 3A is a block diagram illustrating a more detailed example of hybrid ADC 300A, in accordance with an embodiment of the present disclosure. The illustrated example of hybrid ADC 300A includes comparator 204A, ramp signal generator 206, register 210, counter 212, control circuit 214, capacitor 216A, switch 218A, sampling stage 302, offset stage 308, column amplifier 310, feedback capacitor 312, equalizer switch 314, switch 316A, capacitor 318A, memories 320, 325, 330, and 335, and common reference 342. The example of sampling stage 302 is shown as including switch 336 and sampling capacitor 338, while the example of offset stage 308 is shown as including offset capacitors C1, C2, and C3 and complementary switch pairs S1/$\overline{S1}$, S2/$\overline{S2}$, and S3/$\overline{S3}$. Hybrid ADC 300A may be one implementation of any of the previously mentioned hybrid ADCs including hybrid ADC 118 of FIG. 1, and hybrid ADC 200 of FIG. 2.

In operation, switch 336 selectively couples the analog input to one side of sampling capacitor 338, which, in one embodiment, has a capacitance of $2^M$ (e.g., $2^3$=8) times that of feedback capacitor 312. When switch 336 is closed, analog input (e.g., image data) is sampled into sampling capacitor 338. Switch 340 selectively couples one side of sampling capacitor 338 to common reference 342 (e.g., ground voltage level) to reset sampling capacitor 338. The other side of sampling capacitor 338 is coupled to the input of column amplifier 310.

The input of column amplifier 310 is coupled to receive the sampled analog input to provide a constant gain to the input signal. In the illustrated embodiment, the gain of column amplifier 310 is kept constant at $2^M$ times (e.g., 8 times). Feedback capacitor 312 is coupled between the input and output of column amplifier 310 to form a closed loop gain.

Equalizer switch 314 selectively couples the input and output of column amplifier 310 together for amplifier offset cancellation. Switch 218A selectively couples the output of column amplifier 310 to a first input of comparator 204A.

Capacitor 216A is coupled between the first input of comparator 204A and the voltage ramp signal ($V_{RAMP\_A}$), generated by ramp generator 206. When switch 218A is closed, the output of column amplifier 310 is sampled into capacitor 216A. During the SAR ADC mode, $V_{RAMP\_A}$ may be held at positive non-zero voltage $V_{FS}$. During the ramp ADC mode, $V_{RAMP\_A}$ saw tooths down from $V_{FS}$ to a final voltage (e.g., 0V). During this time, switch 218A may be opened or closed.

A second input of comparator 204A is coupled to one side of capacitor 318A. The other side of capacitor 318A is coupled to common reference 342. Switch 316A selectively couples together the second input and output of comparator 204A. In the embodiment where hybrid ADC 300A is included in the readout circuitry of a CMOS image sensor, switch 316A is closed to allow the reset or black level of a pixel cell to be sampled into capacitor 318A. Thus, in this example, the reference voltage that the sampled analog image data is compared to is representative of a reset or black level of that pixel cell.

Offset stage 308 includes M (e.g., 3) number of offset capacitors C1, C2 and C3, and M (e.g., 3) pairs of complementary offset switches S1/$\overline{S1}$, S2/$\overline{S2}$, and S3/$\overline{S3}$. The signals which control offset switches S1/$\overline{S1}$, S2/$\overline{S2}$, and S3/$\overline{S3}$ represent three bits of the digital output, with the signal which controls offset switches S3/$\overline{S3}$ being the most significant of the three bits, and the signal which control offset switches S1/$\overline{S1}$ being the least significant of the three bits. The capacitance of offset capacitors C1, C2 and C3 are binary weighted, with offset capacitor C2 having a capacitance that is twice that of C1, and offset capacitor C3 having a capacitance that is twice that of C2.

The output of comparator 204A is coupled to the input of register 210. Register 210 is configured to selectively couple each pair of offset switches either the common reference 342 or to a reference voltage $V_{REF}$ to provide respective offset voltage to the input of column amplifier 310. For example, when switch is S3 closed and $\overline{S3}$ is open, offset capacitor C3 is coupled to reference voltage $V_{REF}$, and provides an offset capacitance to the signal at the input of column amplifier 310. When switch S3 is open, and $\overline{S3}$ is closed, offset capacitor C3 is coupled to common reference 342 and offset capacitor C3 would not have a capacitive effect on the signal at the input of column amplifier 310. The signals which control offset switches S1/$\overline{S1}$, S2/$\overline{S2}$, and S3/$\overline{S3}$ are complements of one another, so at any given time, only one of each pair of switches will be closed.

During each of the M clock cycles required to achieve the M number of bits (in this case, M=3) when in the SAR ADC mode, control signal SIG3 provided by control circuit 214 controls register 210 to selectively couple each of offset capacitors C1, C2, and C3—one at a time—to $V_{REF}$. Comparator 204A will determine whether that particular bit of analog-to-digital conversion (e.g., the most significant of the three bits) are a '1' or a '0'. The digital values resulting from this conversion during the SAR ADC mode are stored in M-bit memory 330 or 335. In response to whether the output of comparator 204A is a '1' or '0', register 210 will close or open the respective offset switch thereby, over writing control signal SIG3.

For example, during a first of three clock cycles, the digital output of the most significant of the three bits is determined. Control signal SIG3 may close offset switch S3, and open offset switch $\overline{S3}$, which couples reference signal $V_{REF}$ to one side of offset capacitor C3. This will offset the analog signal at the input of column amplifier 310 by one-half $V_{REF}$, since offset capacitor C3 has a capacitance that is one-half that of sampling capacitor 338. Comparator 204A will compare the output of column amplifier 310 with the reference voltage (e.g., reset/black level signal) provided by capacitor 318A. If the analog signal is greater than the reference voltage, comparator 204A will output a '1'. If not, comparator 204A will output a '0'. In this first clock cycle, the output of comparator 204A is the digital representation of the most significant bit of the digital output of hybrid ADC 300A. This output of comparator 204A is written into register 210 and will open or close offset switch S3 and $\overline{S3}$.

With offset switch S3 and $\overline{S3}$ set in the previous clock cycle, the digital output of the next most significant of the three bits is determined. During a second clock cycle, control signal SIG3 selectively couples offset capacitor C2 to reference signal $V_{REF}$, and comparator 204A will determine whether the next digital bit is a '1' or a '0'—this digital value is stored in M-bit memory 330 or 335, as well as register 210. The output of comparator 204A, '1' or '0' will close or open offset switch S2 respectively—and input this value to register 210, over writing control signal SIG3. Using this logic, during a third clock cycle, the last digital MSB of the SAR ADC can be obtained, which would complete the SAR ADC mode of hybrid ADC 300A.

By way of example, in one embodiment, if the sampled analog input is greater than one-half $V_{REF}$, the output of column amplifier 310 will be greater than reference voltage (e.g., reset/black level signal) provided by capacitor 318A, and comparator 204A will output a '1'. Then S3 will be kept closed by register 210, and the remainder of the analog input (i.e., analog input minus one-half $V_{REF}$) is the input for next clock cycle. Otherwise, when the sampled analog input is less than one-half $V_{REF}$, comparator 204A will output a '0'. This will cause register 210 to open switch S3, and couple common reference 342 to offset capacitor C3. The input of column amplifier 310 will return back to the original sampled analog input for next clock cycle.

Once the digital output of the MSB is stored in memory 330 or 335 and the 3 pairs of offset switches set an offset capacitance to the input of column amplifier 310, control circuit 214 may transition hybrid ADC 300A to the ramp ADC mode to obtain the LSBs of the digital signal.

During the ramp ADC mode, the offset and sampled analog image data (e.g., output of column amplifier 310) is compared with the reference voltage (e.g., sampled reset signal). When the two inputs to comparator 204A are equal, a write signal may be sent to one of N-bit LSB memory 320 or 325, at which time the current value of counter 212 is written to one of N-bit LSB memory 320 or 325.

In the illustrated embodiment, hybrid ADC 300A includes two N-bit LSB memories 320 and 325 and two M-bit MSB memories 330 and 335. By having two N-bit memories and two M-bit memories may increase the frame rate of an image sensor. Digital processing logic 150 from FIG. 1 may read from one set of N-bit LSB memory and M-bit MSB memory while readout circuitry 130 uses the hybrid ADC to determine the M+N bit digital output of the next analog image data from bit line 116. Readout circuitry 130 would not have to wait until the present digital output is read out before starting the next ADC. In another embodiment, readout circuitry 130 may comprise one N-bit LSB memory and one M-bit MSB memory.

In one embodiment, the digital output of the hybrid ADC is M+N bits, or as in the previous example, 14 bits, with the SAR ADC mode providing 3 of the most significant of the 14 bits, and ramp ADC mode providing the remaining 11 bits. In another embodiment, a Z-bit hybrid ADC, in which Z is any given integer, may be provided consistent with the teachings herein. In yet another embodiment, a SAR ADC mode may provide 2 to 5 bits, preferably 2 to 4 bits, and the ramp ADC mode may provide 6 to 12 bits, preferably 8 to 11 bits. The range of the SAR ADC mode may be limited by the gain of column amplifier 310, while the range of the ramp ADC may be limited by the exponential increasing number of clock cycles required for ramp analog-to-digital conversion.

In the embodiment where hybrid ADC 300A is included in an image sensor (e.g., image sensor 100 of FIG. 1), each column 112 of pixel array 110 may be coupled to the hybrid ADC 300A such that the SAR ADC mode and ramp ADC mode are performed serially. That is, hybrid ADC 300A may first generate the MSBs of the digital signal while in the SAR ADC mode, exit the SAR ADC mode, and then transition to the ramp ADC mode where then the LSBs of the digital signal are generated. However, in other embodiments, two separate columns of a pixel array may time-share one hybrid ADC.

Figure 3B:
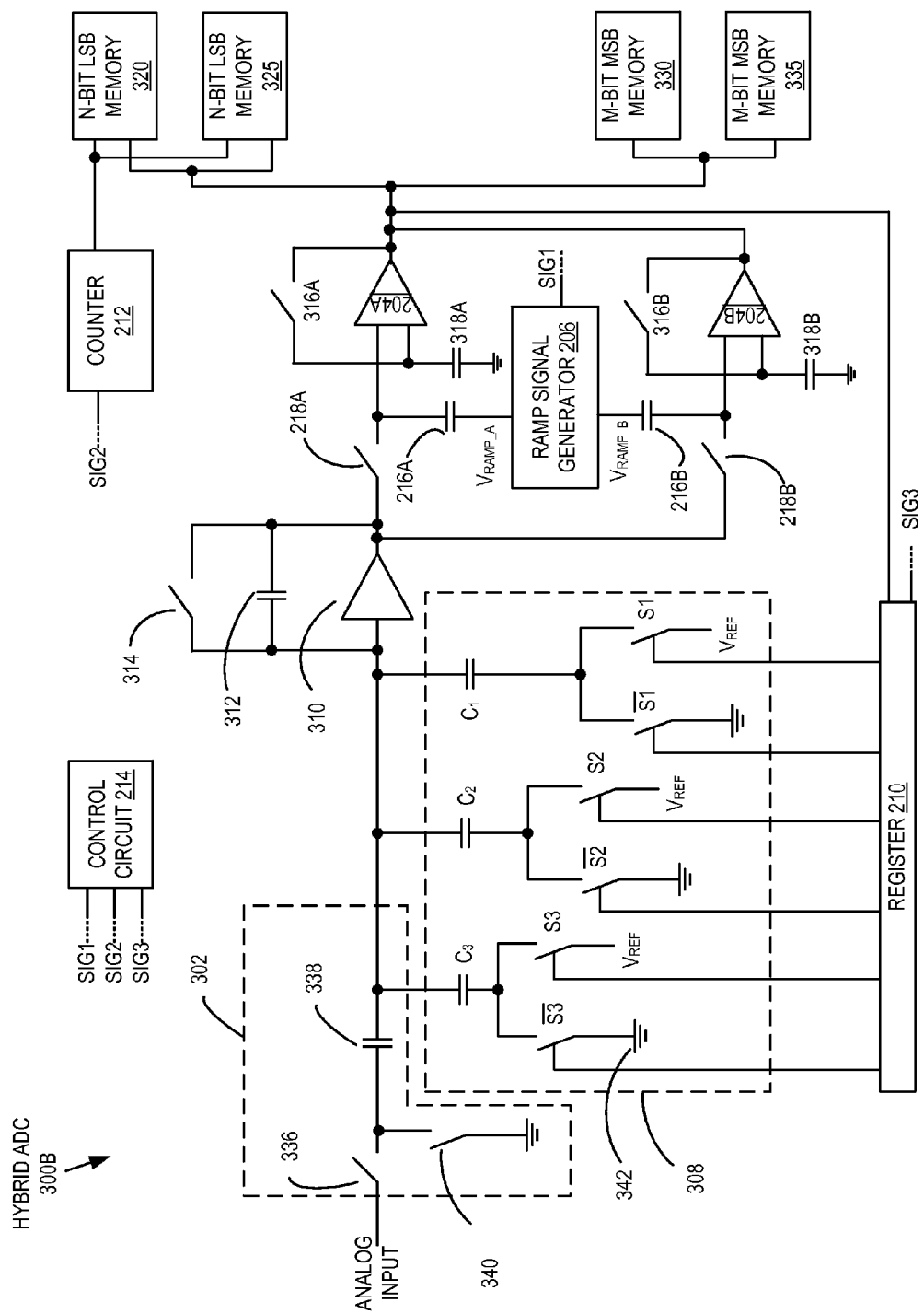
FIG. 3B is a block diagram illustrating an example hybrid ADC including an additional comparator for parallel analog-to-digital conversions, in accordance with an embodiment of the present disclosure.

By way of example, FIG. 3B is a block diagram illustrating an example hybrid ADC 300B including an additional comparator 204B for parallel analog-to-digital conversions, in accordance with an embodiment of the present disclosure. Hybrid ADC 300B is also shown as including switch 218B, capacitor 216B, switch 316B, and capacitor 318B. Comparator 204B is configured to operate similarly to comparator 204A. However, ramp signal generator 206 is configured to generate a second ramp signal $V_{RAMP\_B}$ and counter 212 may include several internal independent counters (not shown).

The addition of comparator 204B allows hybrid ADC 300B to perform parallel analog-to-digital conversions. For example, hybrid ADC 300B may begin using comparator 204A in the SAR ADC mode for generating the MSBs of the digital signal, while comparator 204B is still being used in the ramp ADC mode for generating the LSBs of a previous digital signal. That is, hybrid ADC 300B may begin generating MSBs of a current digital signal before hybrid ADC 300B has completed generating the LSBs of the previous digital signal. Furthermore, hybrid ADC 300B may also begin generating the LSBs of the current digital signal before hybrid ADC 300B has completed generating the LSBs of the previous digital signal.

In one embodiment, the digital signal is representative of the image data sampled from one column 112, while the previous digital signal is representative of image data sampled from a different column 112. In another embodiment, the digital signal and the previous digital signal are representative of image data sampled from same column 112, but from different pixels 114 within that single column. As is apparent, such parallel analog-to-digital conversion (i.e., generating MSBs while also concurrently generating LSBs and/or generating LSBs of a digital signal while also concurrently generating LSBs of a previous digital signal) may increase the rate at which ADC 300B perform conversions. For example, as mentioned above the ramp ADC mode of the disclosed hybrid ADCs may take approximately $2^N$ clock cycles to complete their analog-to-digital conversion of the LSBs with a resolution of N number of bits, while the SAR ADC mode may only take M clock cycles to complete the analog-to-digital conversion of M number of MSBs. Thus, the resolution of the hybrid ADCs may be M+N bits, while only taking approximately $2^N$ clock cycles to complete the conversion of the analog input. By way of illustration, a 3+10 (i.e., M+N) hybrid ADC included in an image sensor may provide for 13 bits of resolution, while the frame rate is comparable to that of a ramp ADC having only 10 bits of resolution.

Furthermore, embodiments of the present invention may allow the circuit designer of an image sensor to keep the same ramp generator used in 10 bits, while generating an extra 3-bits in a SAR ADC mode by reusing the column gain capacitors (as offset capacitors), comparators, and adding only a 3 bit register (e.g., register 210).

Figure 4:
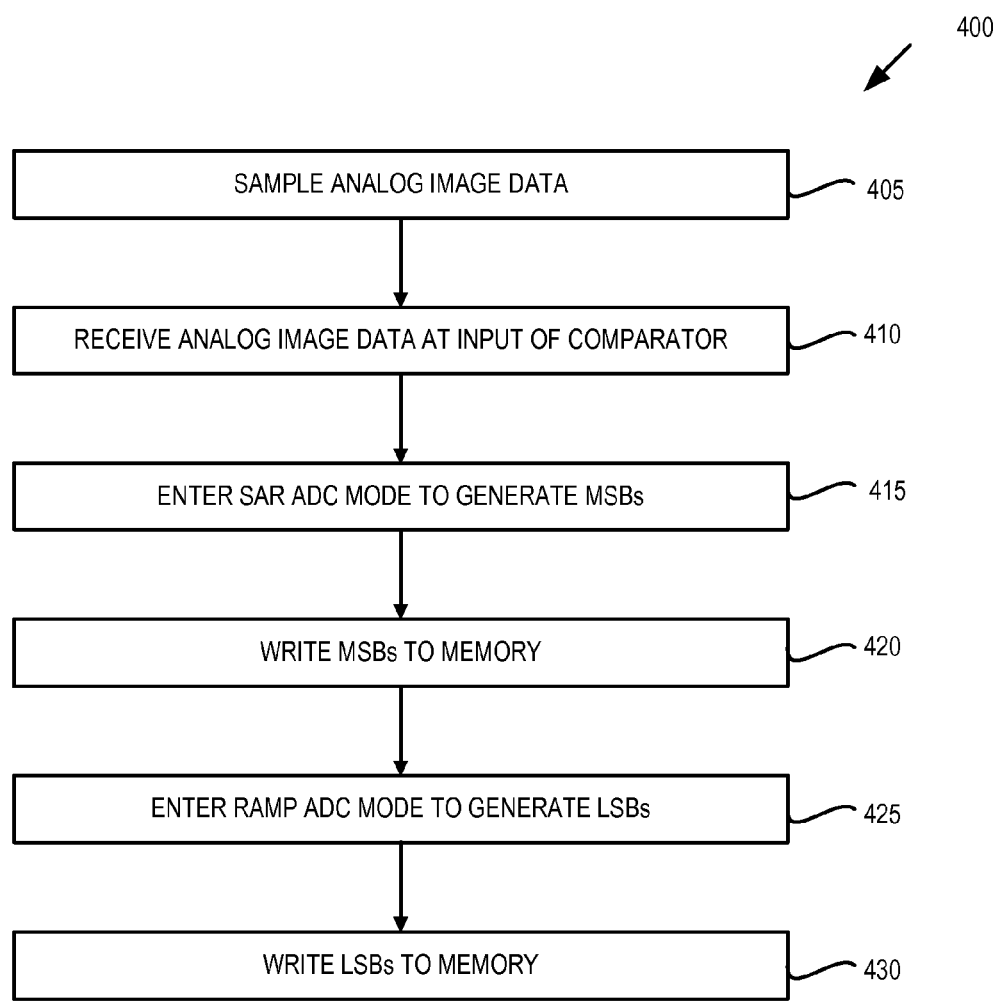
FIG. 4 is a flow diagram illustrating of an example analog-to-digital conversion process using hybrid ADC, in accordance with an embodiment of the present disclosure.

FIG. 4 is a flow diagram illustrating of an example analog-to-digital conversion process 400 using a hybrid ADC, in accordance with an embodiment of the present disclosure. Process 400 will be described with reference to FIGS. 1, 2, and 4-6. Beginning in process block 405, sampling stage 202 samples analog image data (i.e., analog input) received from pixel cell 114 via column bit line 116. Next, after optional amplification of the sampled signal (shown in FIG. 3A), comparator 204A receives the analog image data at input 205.

Figure 5:
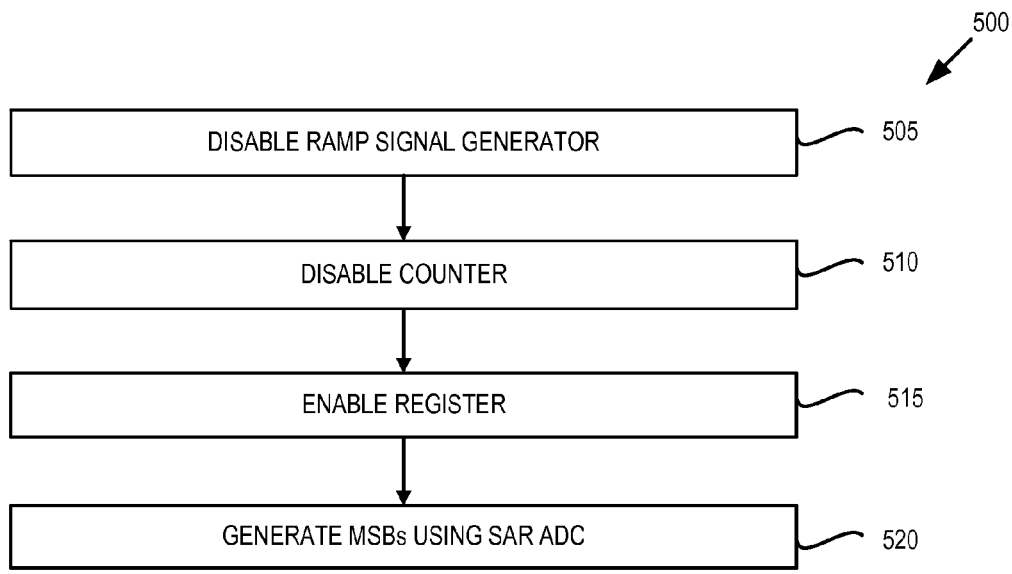
FIG. 5 is a flow diagram illustrating a process for analog-to-digital conversion using a hybrid ADC when in successive approximation register ADC mode.

Control circuit 214 then causes hybrid ADC 200 to enter the SAR ADC mode for generating M number of MSBs of the digital image data (i.e., digital signal). Process 500 of FIG. 5 illustrates one possible implementation of process block 415. As shown in FIG. 5, process block 505 includes control circuit 214 disabling the ramp signal generator 206 via a control signal (e.g., SIG1 of FIG. 3A). As discussed above, when disabled, ramp signal generator 206 may stop providing the ramp signal $V_{RAMP}$, and instead provide a constant, positive, non-zero voltage to input 205 of comparator 204A. Next in process block 510, control circuit 214 disables counter 212 to stop counting by way of a control signal, such as SIG2 of FIG. 3A. In process block 515, control circuit 214 enables SAR 210 to begin controlling offset stage 208 to provide the offset voltage $V_{OFFSET}$ responsive to output 209 of comparator 204A. Process block 520 illustrates hybrid ADC 200 generating the M number of MSBs using successive approximation while in the SAR ADC mode.

Figure 6:
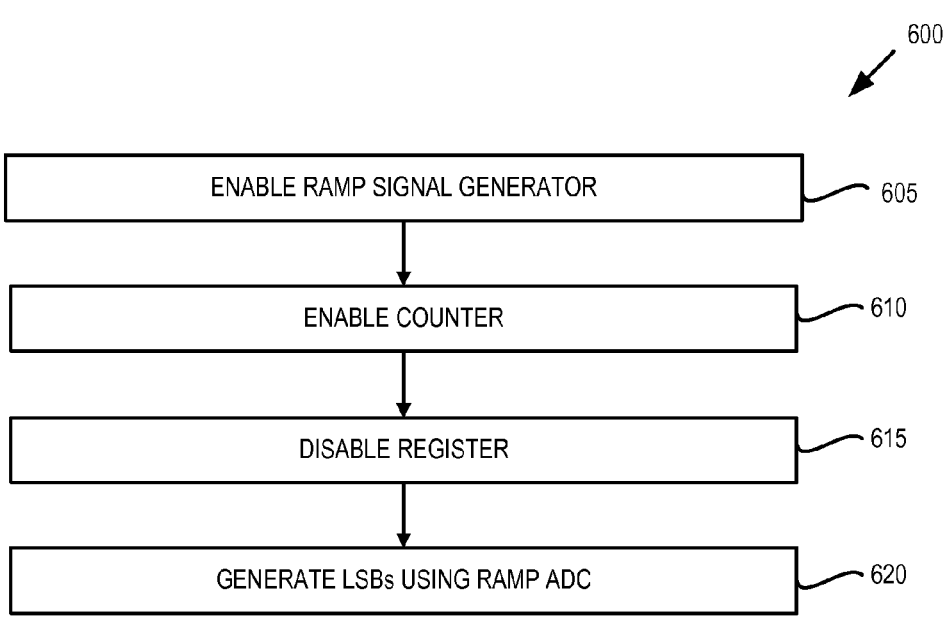
FIG. 6 is a flow diagram illustrating a process for analog-to-digital conversion using a hybrid ADC when in ramp ADC mode.

Returning now to FIG. 4, process 400 proceeds to process block 420 where the resultant MSBs generated are stored in memory 220 or output for digital processing (e.g., digital processing logic 150). Next in process block 425, control circuit 214 causes hybrid ADC 200 to enter into the ramp ADC mode for generating N number of LSBs of the digital image data. Process 600 of FIG. 6 illustrates one possible implementation of process block 425. As shown in FIG. 6, process block 605 includes control circuit 214 enabling the ramp signal generator 206 to begin providing the ramp signal $V_{RAMP}$ to input 205 of comparator 204A. In a process block 610, control circuit 214 enables counter 212 to begin counting. As discussed above, in one embodiment, the beginning of the count by counter 212 may coincide with the beginning of each cycle of the ramp signal $V_{RAMP}$. Process block 615 illustrates control circuit 214 disabling SAR 210. In one embodiment, the disabling of register 210 prevents offset stage 208 from generating the offset voltage $V_{OFFSET}$ in response to output 209 of capacitor 204A. Process block 620 illustrates hybrid ADC 200 generating the N number of LSBs using ramp analog-to-digital conversion while in the ramp ADC mode. Process block 430 of FIG. 4 then illustrates the resultant LSBs generated being stored/written in memory 220 or output for digital processing (e.g., digital processing logic 150). The resultant (M+N)-bit digital output may be used to increase the high dynamic range of an image sensor.

The image sensors disclosed herein may be included in a digital still camera, digital video camera, camera phone, picture phone, video phone, camcorder, webcam, camera in a computer system, security camera, medical imaging device, optical mouse, toy, game, scanner, automotive image sensor, or other types of electronic image and/or video acquisition device. Depending on the implementation, the electronic image and/or video acquisition device may also include other components, such as, for example, a light source to emit light, one or more lenses optically coupled to focus light on the array of pixels, a shutter optically coupled to allow light to pass through the one or more lenses, a processor to process image data, and a memory to store image data, to name just a few examples.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other. For example, a calibration circuit may be coupled with a column ADC circuit via an intervening switch.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known circuits, structures, devices, and operations have been shown in block diagram form or without detail in order to avoid obscuring the understanding of the description.

It will also be appreciated, by one skilled in the art, that modifications may be made to the embodiments disclosed herein, such as, for example, to the configurations, functions, and manner of operation and use, of the components of the embodiments. All equivalent relationships to those illustrated in the drawings and described in the specification are encompassed within embodiments. Further, where considered appropriate, reference numerals or terminal portions of reference numerals have been repeated among the figures to indicate corresponding or analogous elements, which may optionally have similar characteristics.

Various operations and methods have been described. Some of the methods have been described in a basic form in the flow diagrams, but operations may optionally be added to and/or removed from the methods. In addition, while the flow diagrams show a particular order of the operations according to example embodiments, it is to be understood that that particular order is exemplary. Alternate embodiments may optionally perform the operations in different order, combine certain operations, overlap certain operations, etc. Many modifications and adaptations may be made to the methods and are contemplated.

One or more embodiments include an article of manufacture (e.g., a computer program product) that includes a machine-accessible and/or machine-readable medium. The medium may include, a mechanism that provides, for example stores, information in a form that is accessible and/or readable by the machine. The machine-accessible and/or machine-readable medium may provide, or have stored thereon, one or more or a sequence of instructions and/or data structures that if executed by a machine causes or results in the machine performing, and/or causes the machine to perform, one or more or a portion of the operations or methods or the techniques shown in the figures disclosed herein.

In one embodiment, the machine-readable medium may include a tangible non-transitory machine-readable storage media. For example, the tangible non-transitory machine-readable storage media may include a floppy diskette, an optical storage medium, an optical disk, a CD-ROM, a magnetic disk, a magneto-optical disk, a read only memory (ROM), a programmable ROM (PROM), an erasable-and-programmable ROM (EPROM), an electrically-erasable-and-programmable ROM (EEPROM), a random access memory (RAM), a static-RAM (SRAM), a dynamic-RAM (DRAM), a Flash memory, a phase-change memory, or a combinations thereof. The tangible medium may include one or more solid or tangible physical materials, such as, for example, a semiconductor material, a phase change material, a magnetic material, etc.

Examples of suitable machines include, but are not limited to, digital cameras, digital video cameras, cellular telephones, computer systems, other electronic devices having pixel arrays, and other electronic devices capable of capturing images. Such electronic devices typically include one or more processors coupled with one or more other components, such as one or more storage devices (non-transitory machine-readable storage media). Thus, the storage device of a given electronic device may store code and/or data for execution on the one or more processors of that electronic device. Alternatively, one or more parts of an embodiment may be implemented using different combinations of software, firmware, and/or hardware.

It should also be appreciated that references throughout this specification to "one embodiment", "an embodiment", or "one or more embodiments", for example, means that a particular feature may be included in the practice of the invention (e.g., in at least one embodiment). Similarly, it should be appreciated that in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment.

What is claimed is:

1. A hybrid analog to digital converter (ADC) having a successive approximation register (SAR) ADC mode for generating at least one bit of a digital signal and a ramp ADC mode for generating at least one additional bit of the digital signal, the hybrid ADC comprising:
    a sampling stage coupled to receive and sample an analog input;
    a comparator having a first input coupled to receive an output of the sampling stage and a second input coupled to receive a first reference voltage, wherein the first reference voltage is a black level voltage of at least one pixel of an image sensor;
    a ramp signal generator coupled to selectively provide a ramp signal to the first input of the comparator;
    an offset stage coupled to selectively provide a variable offset voltage to the first input of the comparator;
    a register coupled to control the offset stage to set a magnitude of the offset voltage in response to an output of the comparator;
    a counter coupled to the output of the comparator to provide a digital count when the ADC is in the ramp ADC mode; and a control circuit coupled to control the ramp signal generator and the register, wherein,
when in the SAR ADC mode, the control circuit is configured to enable the register to control the offset stage to set the magnitude of the offset voltage in response to the output of the comparator; and
when in the ramp ADC mode, the control circuit is configured to,
enable the ramp signal generator to provide the ramp signal to the first input of the comparator; and
enable the counter to begin providing the digital count in response to the output of the comparator.

2. The hybrid ADC of claim 1, wherein,
when in the SAR ADC mode, the control circuit is further configured to,
disable the ramp signal generator; and
disable the counter; and
when in the ramp ADC mode, the control circuit is further configured to disable the register so that the offset stage is not providing the offset voltage responsive to the output of the comparator.

3. The hybrid ADC of claim 1, wherein the offset stage includes a plurality of binary-weighted capacitors coupled to provide the offset voltage in response to selective enabling of one or more of the binary-weighted capacitors by the register.

4. The hybrid ADC of claim 3, wherein the offset stage further includes at least two complementary switches for each of the binary-weighted capacitors, wherein a binary-weighted capacitor is enabled when a first of the at least two complementary switches is closed to couple the binary-weighted capacitor to a second reference voltage, and wherein the binary-weighted capacitor is disabled when a second of the at least two complementary switches is closed to couple the binary-weighted capacitor to a common reference.

5. The hybrid ADC of claim 1, wherein the ramp signal generator is configured to provide a constant non-zero voltage to the first input of the comparator when the ramp signal generator is disabled.

6. The hybrid ADC of claim 1, wherein the hybrid ADC generates one or more most significant bits of the digital signal when in the SAR ADC mode, and one or more least significant bits of the digital signal when in the ramp ADC mode.

7. The hybrid ADC of claim 6, further comprising a second comparator having an input coupled to compare a second output of the sampling stage to a third reference voltage, wherein the hybrid ADC is configured to begin generating the one or more most significant bits of the digital signal before the hybrid ADC has completed generating the least significant bits of a previous digital signal.

8. The hybrid ADC of claim 7, wherein the hybrid ADC is configured to begin generating the one or more least significant bits of digital signal before the hybrid ADC has completed generating the one or more least significant bits of the previous digital signal.

9. The hybrid ADC of claim 1, wherein a number of bits generated by the hybrid ADC when in the SAR ADC mode is less than the number of bits generated by the hybrid ADC when in the ramp ADC mode.

10. An image sensor for generating digital image data, the image sensor comprising:
a pixel array including a plurality of pixel cells arranged into rows and columns for capturing analog image data;
a bit line coupled to at least one of the pixels within a column of the pixel array; and
readout circuitry coupled to the bit line to readout the analog image data from the at least one pixel, the readout circuitry including a hybrid analog to digital converter (ADC) having a successive approximation register (SAR) ADC mode for generating at least one bit of the digital image data and a ramp ADC mode for generating at least one additional bit of the digital image data, the hybrid ADC including:
a sampling stage coupled to receive and sample the analog image data;
a comparator having a first input coupled to receive an output of the sampling stage and a second input coupled to receive a first reference voltage, wherein the first reference voltage is a black level voltage of the at least one pixel;
a ramp signal generator coupled to selectively provide a ramp signal to the first input of the comparator;
an offset stage coupled to selectively provide a variable offset voltage to the first input of the comparator;
a register coupled to control the offset stage to set a magnitude of the offset voltage in response to an output of the comparator;
a counter coupled to the output of the comparator to provide a digital count when the ADC is in the ramp ADC mode; and
a control circuit coupled to control the ramp signal generator and the register, wherein,
when in the SAR ADC mode, the control circuit is configured to enable the register to control the offset stage to set the magnitude of the offset voltage in response to the output of the comparator; and
when in the ramp ADC mode, the control circuit is configured to,
enable the ramp signal generator to provide the ramp signal to the first input of the comparator;
enable the counter to begin providing the digital count in response to the output of the comparator.

11. The image sensor of claim 10, wherein,
when in the SAR ADC mode, the control circuit is further configured to,
disable the ramp signal generator; and
disable the counter; and
when in the ramp ADC mode, the control circuit is further configured to disable the register so that the offset stage is not providing the offset voltage responsive to the output of the comparator.

12. The image sensor of claim 10, wherein the offset stage includes a plurality of binary-weighted capacitors coupled to provide the offset voltage in response to selective enabling of one or more of the binary-weighted capacitors by the register.

13. The image sensor of claim 12 wherein the offset stage further includes at least two complementary switches for each of the binary-weighted capacitors, wherein a binary-weighted capacitor is enabled when a first of the at least two complementary switches is closed to couple the binary-weighted capacitor to a second reference voltage, and wherein the binary-weighted capacitor is disabled when a second of the at two complementary switches is closed to couple the binary-weighted capacitor to a common reference.

14. The image sensor of claim 10, wherein the ramp signal generator is configured to provide a constant non-zero voltage to the first input of the comparator when the ramp signal generator is disabled.

15. The image sensor of claim 10, wherein the hybrid ADC generates one or more most significant bits of the digital image data when in the SAR ADC mode, and one or more least significant bits of the digital image data when in the ramp ADC mode.

16. The image sensor of claim 15, wherein the hybrid ADC further comprises a second comparator having an input coupled to compare a second output of the sampling stage to a third reference voltage, wherein the hybrid ADC is configured to begin generating the one or more most significant bits of the digital image data before the hybrid ADC has completed generating the least significant bits of a previous digital image data.

17. The image sensor of claim 16, wherein the hybrid ADC is configured to begin generating the one or more least significant bits of digital image data before the hybrid ADC has completed generating the one or more least significant bits of the previous digital image data.

18. The image sensor of claim 10, wherein a number of bits generated by the hybrid ADC when in the SAR ADC mode is less than the number of bits generated by the hybrid ADC when in the ramp ADC mode.

19. A method of converting analog image data into digital image data with a hybrid analog to digital converter (ADC), the method comprising:
   sampling the analog image data received from a column bit line of an image sensor;
   receiving the sampled analog image data at a first input of a comparator of the hybrid ADC, wherein the comparator is coupled to compare the analog image data to a first reference voltage that is received at a second input of the comparator, wherein the first reference voltage is a black level voltage of at least one pixel of an image sensor;
   generating one or more most significant bits (MSBs) of the digital image data with the hybrid ADC while the hybrid ADC is in a successive approximation register (SAR) analog to digital (ADC) mode; and
   generating one or more least significant bits of the digital image data with the hybrid ADC while the hybrid ADC is in a ramp ADC mode.

20. The method of claim 19, wherein the SAR ADC mode includes:
   disabling a ramp signal generator of the hybrid ADC;
   disabling a counter of the hybrid ADC; and
   enabling a register of the ADC to set a magnitude of an offset voltage provided to the first input of the comparator in response to an output of the comparator.

21. The method of claim 20, wherein the ramp ADC mode includes:
   enabling the ramp signal generator of the hybrid ADC;
   enabling the counter of the hybrid ADC; and
   disabling the register of the ADC so that the offset voltage is not provided to the first input of the comparator in response to the output of the comparator.

22. The method of claim 19, wherein a number of the MSBs generated by the hybrid ADC when in the SAR ADC mode is less than the number of LSBs generated by the hybrid ADC when in the ramp ADC mode.

23. The method of claim 19, further comprising beginning the generating of the one or more MSBs of the digital image data before a generating of the LSBs of a previous digital image data is completed.

24. The method of claim 23, further comprising beginning the generating of the one or more LSBs of the digital image data before the generating of the LSBs of the previous digital image data is completed.

* * * * *